(12) United States Patent
Sforzin et al.

(10) Patent No.: US 12,088,322 B2
(45) Date of Patent: Sep. 10, 2024

(54) METHOD AND SYSTEM FOR ON-ASIC ERROR CONTROL DECODING

(71) Applicant: Micron Technology, Inc., Boise, ID (US)

(72) Inventors: Marco Sforzin, Boise, ID (US); Paolo Amato, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/894,777

(22) Filed: Aug. 24, 2022

(65) Prior Publication Data

US 2023/0231578 A1  Jul. 20, 2023

Related U.S. Application Data

(60) Provisional application No. 63/301,020, filed on Jan. 19, 2022.

(51) Int. Cl.
*H03M 13/19* (2006.01)
*H03M 13/00* (2006.01)
*H03M 13/15* (2006.01)

(52) U.S. Cl.
CPC ......... *H03M 13/19* (2013.01); *H03M 13/159* (2013.01); *H03M 13/617* (2013.01)

(58) Field of Classification Search
CPC .. H03M 13/159; H03M 13/617; H03M 13/19; G06F 11/10; G06F 11/1048
See application file for complete search history.

(56) References Cited

U.S. PATENT DOCUMENTS

| | | | |
|---|---|---|---|
| 11,689,219 B1 * | 6/2023 | Kanter | H03M 13/2909 714/746 |
| 11,700,017 B2 * | 7/2023 | Pae | H03M 13/616 714/758 |
| 2008/0163032 A1 * | 7/2008 | Lastras-Montano | G06F 11/1044 714/785 |

(Continued)

OTHER PUBLICATIONS

W. Gao and S. Simmons, "A study on the VLSI implementation of ECC for embedded DRAM," CCECE 2003—Canadian Conference on Electrical and Computer Engineering. Toward a Caring and Humane Technology (Cat. No. 03CH37436), Montreal, QC, Canada, 2003, pp. 203-206 vol. 1 (Year: 2003).*

*Primary Examiner* — Cynthia Britt
(74) *Attorney, Agent, or Firm* — Wood IP LLC; Theodore A. Wood

(57) ABSTRACT

There are provided methods and systems for on-ASIC error control coding for verifying the integrity of data from a memory. For example, there is provided a method for encoding data into a beat. The method can be executed by a digital system configured to receive the data and construct the beat. The method includes assembling, by the digital system, a plurality of words consecutively. The plurality of words can include a first set of words in which each word has a length W, where W is the beat width. The plurality of words can further include a second set of words in which each word has a length that is smaller or equal to W. The method can further include constructing a parity word of length W, wherein each bit in the parity word is a parity associated with a distinct word in the first and second set of words. The method further includes adding the parity word to the plurality of words to form the beat.

14 Claims, 3 Drawing Sheets

(56) References Cited

U.S. PATENT DOCUMENTS

| | | | | |
|---|---|---|---|---|
| 2010/0005375 | A1* | 1/2010 | Dell | G06F 11/10 |
| | | | | 714/E11.032 |
| 2012/0198309 | A1* | 8/2012 | Alves | G06F 11/10 |
| | | | | 714/763 |
| 2015/0311920 | A1* | 10/2015 | Wang | G06F 11/1012 |
| | | | | 714/764 |
| 2017/0134049 | A1* | 5/2017 | Hsiao | H03M 13/6502 |
| 2021/0359710 | A1* | 11/2021 | Jo | G06F 1/04 |

* cited by examiner

METHOD AND SYSTEM FOR ON-ASIC ERROR CONTROL DECODING

CROSS-REFERENCE TO RELATED APPLICATION

This application claims priority to U.S. Provisional Application No. 63/301,022 filed on Jan. 19, 2022, titled "Method for implementing ECC encoding by processing beats of data," which is hereby expressly incorporated herein by reference in its entirety.

FIELD OF TECHNOLOGY

This disclosure relates generally to one or more systems and methods for memory. In particular, the disclosure relates to improved error correction code (ECC) techniques for detecting and correcting errors due to memory device failures.

BACKGROUND

A memory module is an important component of a computing system. For example, memories may be used to store volatile information associated with files that are being used or tasks that are being conducted. Such memories are termed random access memory (RAM). Similarly, memories can also permanently store information, in which case they are termed read-only memories (ROMs).

Memories, especially those that hold transitory information like RAMs, may be subjected to errors. For example, and not by limitation, an error may originate from design failures, defects in the constitutive devices of the memory, from electrical noise in any of the components of the memory or from surrounding systems, or from device degradation resulting from repeated accesses. Errors may either be soft errors (e.g., those that are caused by system noise or by impinging alpha particles) or they may be hard errors. Soft errors are transient in nature whereas hard errors are permanent.

In either case, these errors must be detected and fixed. In the case of hard errors, the memory sections in which they occur may be flagged as being corrupted, and as such, their addresses may be removed from the pool of accessible addresses of the controller. The infrastructure for detecting and/or fixing these errors are usually includes on-die peripheral systems configured to scan the memory array and execute an error correcting algorithm. Here, the term on-die refers to components that are located on the same chip as the memory elements.

The algorithms executed may generally include a set of hardware-mediated procedures for assessing the memory's section. For example, and not by limitation, one executable routine may be configured to perform an error correction check (ECC) for a memory word that is n-bit long. As such, the memory array (n×m) is scanned at least m times, and the ECC is executed on each n-bit word that is included in the memory. If an error is found, the peripheral system may be configured to notify a higher level system which in turn may execute a remedial action. Such remedial action may include correcting the memory or flagging the n-bit word in which the error has been detected as being corrupted and thus unusable.

With the advent of novel high-speed protocols like the Compute Express Link that is optimized for speed, the operations described above may contribute to significant latency and consequently reduce the achievable data rate from and to the memory. Furthermore, As such there is a need for systems and methods that can evaluate a memory's integrity, fix errors, and flag unusable sections, without compromising data rates.

SUMMARY

The embodiments featured herein help solve or mitigate the above noted issues as well as other issues known in the art. For example, the embodiments include methods and system for encoding and/or decoding error correction data from beats of data. As an example, and not by limitation, an embodiment may include a method for encoding data into a beat. The method can be executed by a digital system configured to receive the data and construct the beat. The method includes assembling, by the digital system, a plurality of words consecutively. The plurality of words can include a first set of words in which each word has a length W, where W is the beat width. The plurality of words can further include a second set of words in which each word has a length that is smaller or equal to W. The method can further include constructing a parity word of length W, wherein each bit in the parity word is a parity associated with a distinct word in the first and second set of words. The method further includes adding the parity word to the plurality of words to form the beat.

Another embodiment provides a system configured for encoding data into a beat. The system can include a first module configured to assemble a plurality of words consecutively. The plurality of words can include a first set of words in which each word has a length W, where W is the beat width. The plurality of words can further include a second set of words in which each word has a length that is smaller or equal to W. The system can include a second module configured to construct parity word of length W, and each bit in the parity word may be a parity associated with a distinct word in the first and second set of words. The system can further include a third module configured to add the parity word to the plurality of words to form the beat.

Another embodiment provides a method for decoding a beat of data received by a digital system. The method can include generating a syndrome vector from the beat and from a predetermined parity check matrix. Generating the vector can include computing syndrome components based on the parity check matrix and the beat.

Another embodiment may provide a system configured for decoding a beat of data. The system may include a first module configured to generate a syndrome vector from the beat and from a parity check matrix by computing syndrome components based on the parity check matrix and the beat. The system may further include a second module configured to accumulate partial contributions of the beat into a register based on the syndrome components to create the syndrome vector.

Additional features, modes of operations, advantages, and other aspects of various embodiments are described below with reference to the accompanying drawings. It is noted that the present disclosure is not limited to the specific embodiments described herein. These embodiments are presented for illustrative purposes only. Additional embodiments, or modifications of the embodiments disclosed, will be readily apparent to persons skilled in the relevant art(s) based on the teachings provided.

BRIEF DESCRIPTION OF THE DRAWINGS

Illustrative embodiments may take form in various components and arrangements of components. Illustrative embodiments are shown in the accompanying drawings, throughout which like reference numerals may indicate corresponding or similar parts in the various drawings. The drawings are only for purposes of illustrating the embodiments and are not to be construed as limiting the disclosure. Given the following enabling description of the drawings, the novel aspects of the present disclosure should become evident to a person of ordinary skill in the relevant art(s).

DETAILED DESCRIPTION

While the illustrative embodiments are described herein for particular applications, it should be understood that the present disclosure is not limited thereto. Those skilled in the art and with access to the teachings provided herein will recognize additional applications, modifications, and embodiments within the scope thereof and additional fields in which the present disclosure would be of significant utility.

Several embodiments and teachings featured herein provide one or more features for error control coding for assessing data integrity. While the embodiments described are discussed in the context of memory applications, one of ordinary skill in the art will readily recognize that the teachings, methods, systems, and example embodiments can be employed in other applications that require data integrity assessment. Furthermore, while the applications discussed relate to dynamic RAMs (DRAM), one of ordinary skill in the art will readily recognize that the concepts and example embodiments described apply to other types of memories and memory architectures without departing from the intended scope of the present disclosure.

On-die ECC and link ECCs are often used with DRAM components in order to find errors in memory data before and after transmission of the data to another component. This approach increases the cost of DRAM components, both from a price and area standpoint. Furthermore, this typical approach requires that separate management tasks by the memory controller, and as such, it has a high reliability burden.

The embodiments provided herein obviate the need for on-die ECC and link ECCs for DRAM components. In the embodiments, these components are replaced by an on-ASIC ECC in DRAM-managed solutions, conferring the advantages of reduced costs and increased reliability, in contrast to the typical approaches described above.

Data coming from memories are typically organized in bursts of beats. In a DRAM component, the length of a beat in a burst is typically 16 or 32 bits. Each beat is thus 8 or 16 bit mode, depending on the direct query (DQ) mode of the component. In an example embodiment for use with a DRAM-managed solution, data/symbols can be grouped to be read from DRAM components together over multiple data bursts (e.g. beats) as a memory transfer block (MTB). The MTB is composed of burst length (BL)×W bits. For example, and not by limitation, BL is typically 16 or 32. Burst width (BW), which corresponds also to the readout burst width, is typically 8 or 16. In alternate embodiments, W can be 9 or 18, depending on the additional DQ or additional pins to exchange data such as DMI pins. In the embodiments, the beat as described above can be encoded to form the MTB that includes a code word for further error checking and correction.

Figure 1:
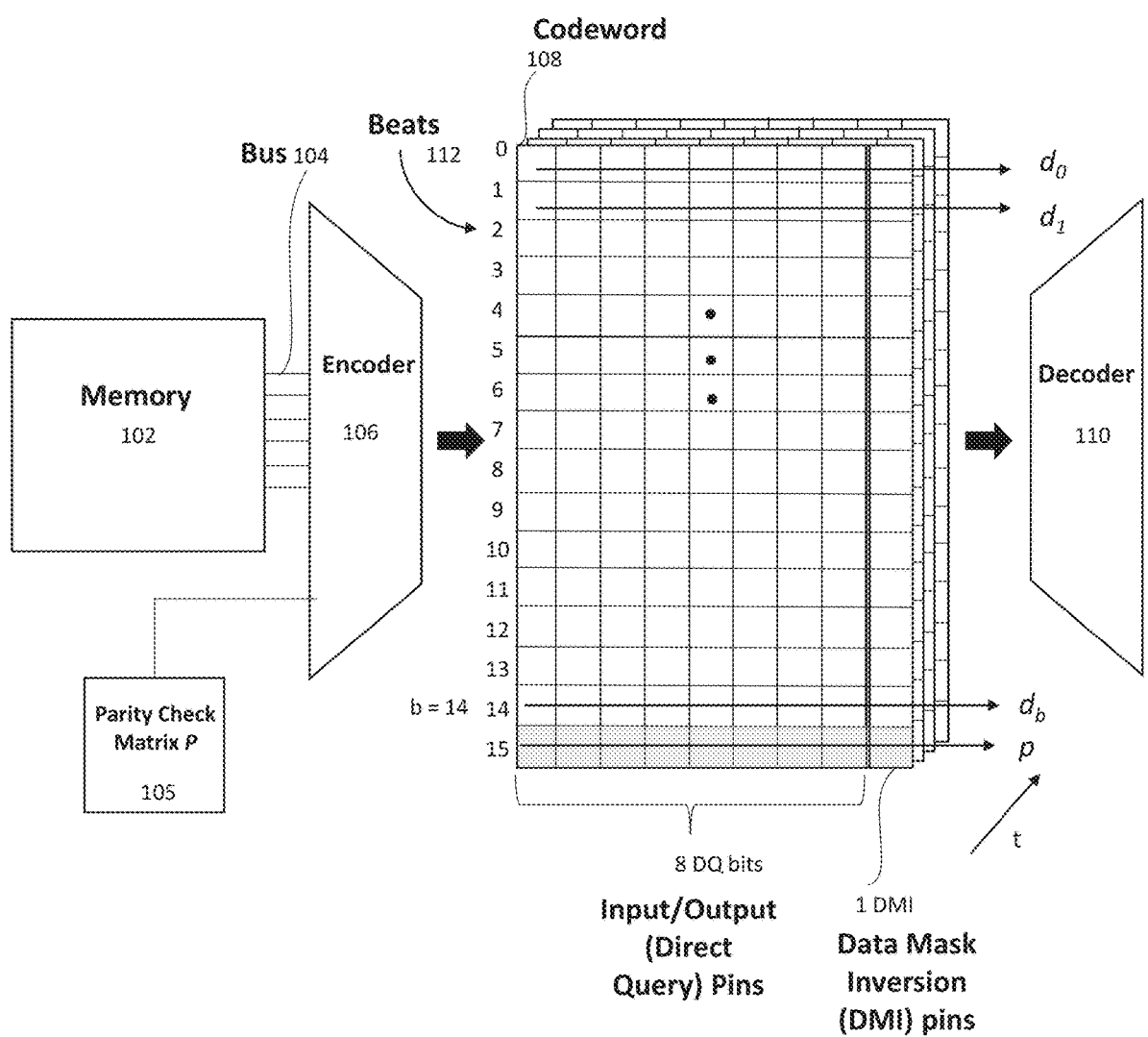
FIG. 1 illustrates a system according to an embodiment.

FIG. 1 illustrates an example system 100 according to an embodiment. The system 100 includes a memory 102, which may be, without limitation a DRAM array. One of skill in the art will readily recognize that that the memory may have an arbitrary size. In other words, the teachings featured herein apply to arrays of various sizes. The memory 102 may be interfaced to additional components via a read/write bus 104. The bus 104 may have a predetermined size, as governed by the design of the memory architecture. In the example applications described herein, the bus 104 may be used in its entirety or a subset of bus lines may be used without departing from the teachings of the present disclosure.

The bus 104 may connect the memory 102 to an encoder 106 which is configured to read data from the memory 102 and construct a codeword (not shown having error correction information therein. The codeword may be included within an MTB 108. The encoder 106 may be configured to construct the codeword based on data read from the memory 102 via the bus 104 and a predetermined parity check matrix (P) 105, which for example may be stored in a register. Data (d) may be encoded to form a payload that includes parity data in the form of a parity word (p). An exemplary encoding process will be described below with respect to the embodiment featured in FIG. 2.

The codeword 108 includes a plurality of words (d0, d1, - - - db) from the memory 102 and the parity word appended at the end of the codeword. In the embodiment shown in FIG. 1, the parity word p is appended to the data from the memory 102, but this is by example only and not by limitation. In alternate embodiments, the parity word p may be included anywhere within the codeword formed within the MTB 108.

Furthermore, the MTB 108 of FIG. 1 is shown to have 15 words and the parity word p. This is only by example. Specifically, based on the memory 102's architecture and communication protocols and bus width, the codeword 108 may be a beat of data that has a different size than what is shown in FIG. 1. In the exemplary codeword 108, the beat has 8 DQ bits and 1 DMI for each word in the beat (i.e., the data and the parity words).

The system 100 can be configured to transmit the codeword 108 after encoding to another system (not shown in its entirety). The other system may have a front-end that has a decoder 110. The decoder 110 may be configured to unpack the codeword 108 and further determine based on the parity word p and additional resources whether there is an error in the data contained in the codeword 108. The decoder 110 may then take several actions, which include identifying the location of the error, fixing the error, or reporting the error and its location to a higher level system, which itself may take additional remedial actions. The system 100 may be configured to transmit beats of data in time t, where each data beat transmitted is structured as described above, i.e., like the codeword 108.

Figure 2:
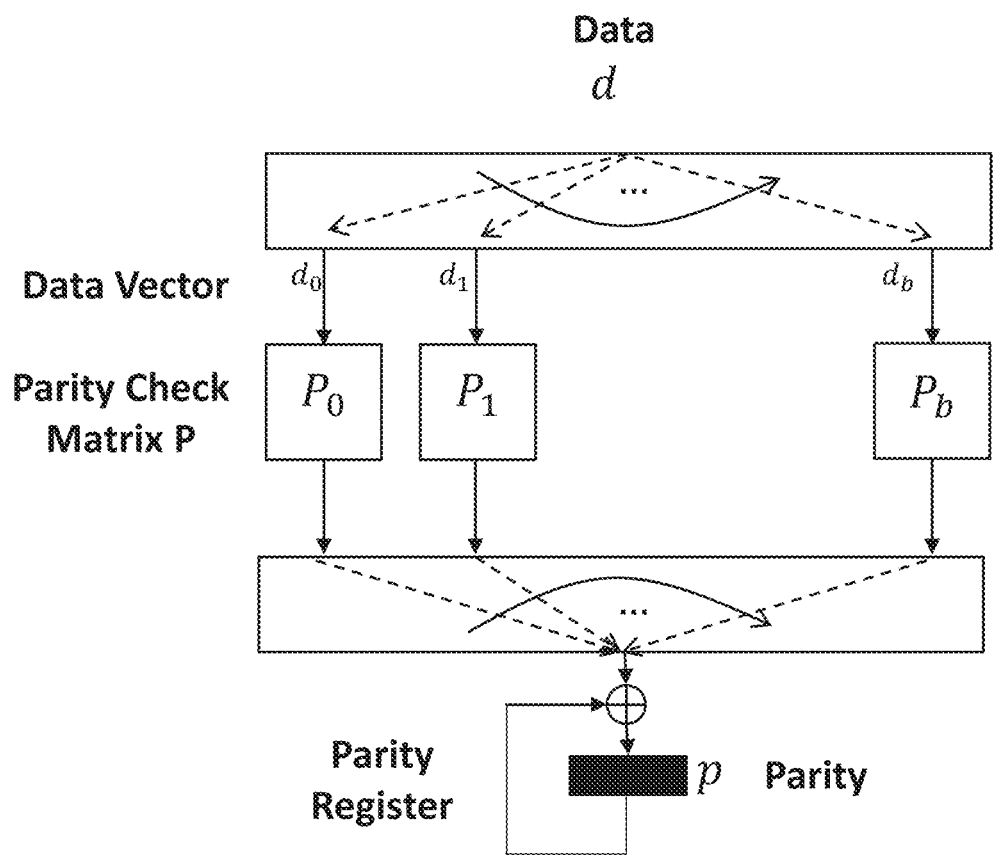
FIG. 2 illustrates an encoding scheme according to an embodiment.

FIG. 2 illustrates an encoding scheme 200 that may be undertaken by the encoder 106 shown in FIG. 1. The placement of the codeword in the MTB 108 may be exploited to simplify the implementation of the encoding engine. Since at each beat the memory receives (or sends) W bits simultaneously, the encoder 106 processes operations that are exactly W bits wide. The exemplary encoding scheme 200 is described below.

The parity word p is computed as $p=dP$, where d is the data from the memory 102 ($d=d0, d1 \ldots db$) and P is the parity check matrix 105 shown in FIG. 1, where $P=[P0, P1, \ldots, Pb]$. Furthermore, di is the vector of data in the beat i, and db may have length that is smaller than W, i.e., $b \le BL-1$. The parity is computed as $p=dP=d0\ P0+d1\ P1+\ldots+db\ Pb$. It is convenient to store the parity at the end of the payload in the MTB in a parity register. The parity register may be initialized to 0, and it may accumulate the partial contributions of the beats (i.e., d0P0, d1P1, etc.) The parity register thus includes the ECC parity, and its content becomes ready and finalized when the last chunk of data has been processed.

In the exemplary encoding scheme 200, the $BL=16$, $W=9$, $BL \times W=144$, which means that the codeword length is $n=144$. Considering an extended Hamming code for the parity ($r=9$), the payload is $k=n-r=135$.

Figure 3:
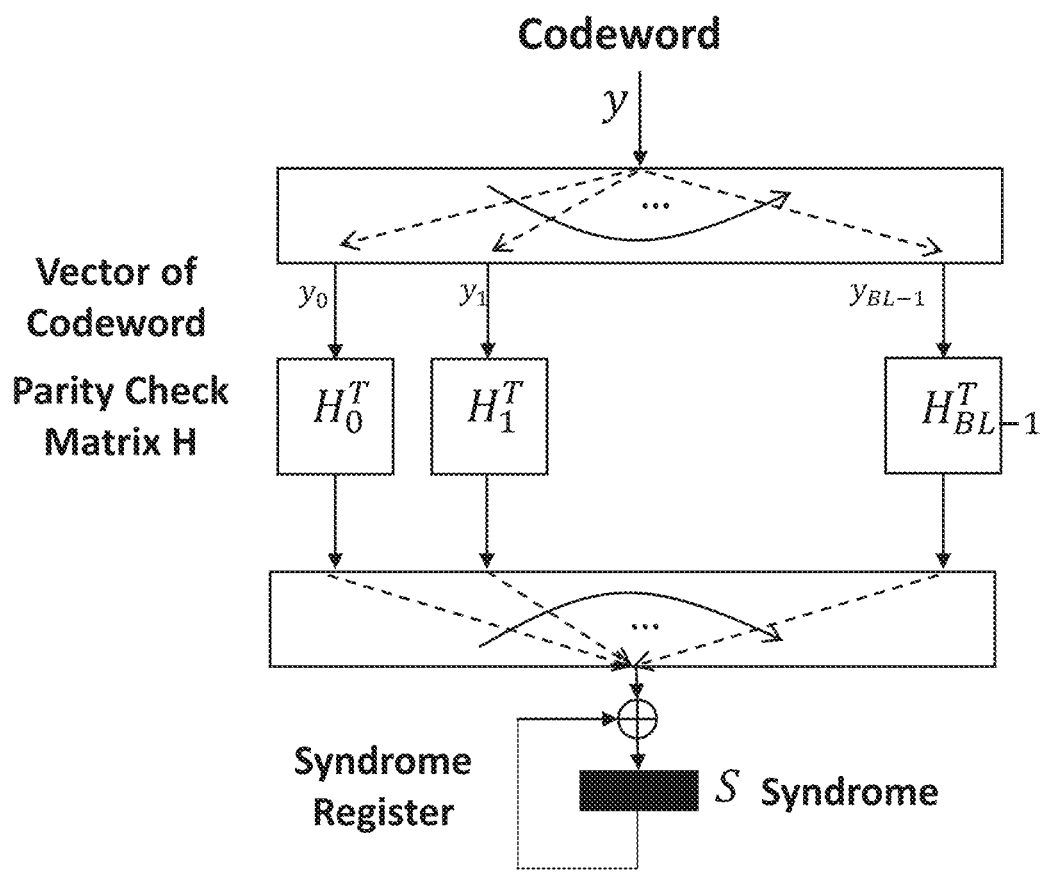
FIG. 3 illustrates a decoding scheme according to an embodiment.

Turning now the decoder 110, its operation and structure are described with respect to FIG. 3 and an exemplary decoding scheme 300. In the decoding scheme 300, as an example and not by limitation, consider linear codes, and in particular the Hamming codes and the Bose-Chaudhuri-Hocquenghem (BCH) codes correcting up to t errors, with $t=2, 3, \ldots$. As an example, set $t=2$ for an exemplary application. The exemplary decoding process starts with the decoder 110 computing the syndrome S starting from the received codeword y. Specifically, the decoder 110 computes $S=yH^T$. As such, the decoding of the BCH codes starts with computing the syndrome components $S_1, S_3, \ldots$ starting from the received codeword y as $S_1=y(\alpha)$, $S=y(\alpha^3)$, or, simply: $S_1=yA_1$ and $S_3=yA_3$.

Furthermore, similar to the parity register of the encoding scheme 200, the syndrome register denoted S is initialized to 0, and it can accumulate the partial contributions of the beats to finally contain the syndrome. Its content will be ready after the last data chunk has been processed. The integrity of the data may be assessed based on the syndrome and the codeword received y once the syndrome is finalized.

Generally, the teaching of the present disclosure provides methods and application-specific systems configured to implementing on-ASIC ECC encoding or decoding on beats of data. For example, and without limitation, several general embodiments are now described. One example embodiment provides a method for encoding data into a beat. The method can be executed by a digital system configured to receive the data and construct the beat. The method includes assembling, by the digital system, a plurality of words consecutively.

The plurality of words can include a first set of words in which each word has a length W, where W is the beat width. The plurality of words can further include a second set of words in which each word has a length that is smaller or equal to W. The method can further include constructing a parity word of length W, wherein each bit in the parity word is a parity associated with a distinct word in the first and second set of words. The method further includes adding the parity word to the plurality of words to form the beat.

The method can further include receiving the data from a memory. The beat can have a burst length L, and the method can include forming additional beats of size $L \times W$ upon receiving the data. The method can include transmitting the plurality of beats in bursts, and burst can include a single beat. The memory may be a DRAM, and the beat may be a memory transfer block from the DRAM.

The digital system is an on-application specific integrated circuit error control coding system communicatively coupled to the memory. The method can further include initializing a register of the digital system and saving the parity word in the register. Furthermore, adding the parity word to the plurality of words can include appending the parity word to the plurality of words. And appending the parity word can include placing the parity word after the second set of words.

Another embodiment provides a system configured for encoding data into a beat. The system can include a first module configured to assemble a plurality of words consecutively. The plurality of words can include a first set of words in which each word has a length W, where W is the beat width. The plurality of words can further include a second set of words in which each word has a length that is smaller or equal to W. The system can include a second module configured to construct parity word of length W, and each bit in the parity word may be a parity associated with a distinct word in the first and second set of words. The system can further include a third module configured to add the parity word to the plurality of words to form the beat.

The system can further include an input section configured to receive the data from a memory, and the beat can have a burst length L. Furthermore, the system can generate additional beats of size $L \times W$ upon receiving the data. The system of claim can further include a transmitter section configured to transmit the plurality of beats in bursts, and a burst can include a single beat.

The memory may be a DRAM, and the beat may be a memory transfer block from the DRAM. The system is an on-application specific integrated circuit error control coding system communicatively coupled to the memory. The system can further include a plurality of registers configured to hold the data beat. Adding the parity word to the plurality of words can include appending the parity word to the plurality of words, for example, after the second set of words.

Another embodiment provides a method for decoding a beat of data received by a digital system. The method can include generating a syndrome vector from the beat and from a predetermined parity check matrix. Generating the vector can include computing syndrome components based on the parity check matrix and the beat. The method can further include accumulating partial contributions of the beat into a register of the digital system based on the syndrome components in order to create the syndrome vector. The method further includes checking whether an error exists in the beat based on the syndrome vector and correcting the error. The beat may be received from a memory, which may be a DRAM. The beat may be a memory transfer block. The beat may be a Hamming code.

Yet, another embodiment may provide a system configured for decoding a beat of data. The system may include a first module configured to generate a syndrome vector from the beat and from a parity check matrix by computing syndrome components based on the parity check matrix and the beat. The system may further include a second module configured to accumulate partial contributions of the beat into a register based on the syndrome components to create the syndrome vector.

The system may be configured to check whether an error exists in the beat based on the syndrome vector. The first module is further configured to receive the beat from a memory. The memory may be a DRAM, and the beat may be a memory transfer block. The system may be an on-application specific integrated circuit (on-ASIC) error control coding (ECC) system communicatively coupled to a memory. The system may be configured to detect and correct an error based on the syndrome vector and the beat. The beat may be a Hamming code. Furthermore, the beat may be a two-dimensional memory transfer block. The system may be further configured to receive a plurality of beats.

Those skilled in the relevant art(s) will appreciate that various adaptations and modifications of the embodiments described above can be configured without departing from the scope and spirit of the disclosure. Therefore, it is to be understood that, within the scope of the appended claims, the disclosure may be practiced other than as specifically described herein.

What is claimed is:

1. A memory system comprising:
a plurality of memory components; and
a controller in communication with the plurality of memory components and configured to:
store at least one codeword read from the plurality of memory components as beats of data organized to form a memory transfer block (MTB); and
perform error correction code (ECC) operations on the beats of data within the MTB:
wherein the ECC operations include performing (i) encoding the MTB data as a function of a data vector within each of the beats and a parity check matrix and (ii) decoding including computing a syndrome of the encoded MTB data and decoding corresponding Bose-Chaudhuri-Hocquenghem (BCH) codes; and
wherein the performing of the encoding and decoding include vector matrix multiplication.

2. The system of claim 1, further including checking whether an error exists in the beat based on the syndrome vector.

3. The system of claim 2, wherein the memory is a dynamic random access memory (DRAM).

4. The system of claim 3, wherein the MTB data is representative of the at least one codeword.

5. The system of claim 4, wherein the digital system is an on-application specific integrated circuit (on-ASIC) error control coding (ECC) system communicatively coupled to a memory.

6. The system of claim 5, further including correcting the error.

7. The system of claim 6, wherein the beat is a Hamming code.

8. A method implemented via a plurality of memory components in communication with a controller comprising:
a controller in communication with the plurality of memory components and configured to:
store at least one codeword read from the plurality of memory components as beats of data organized to form a memory transfer block (MTB); and
perform error correction code (ECC) operations on the stored codeword;
wherein the ECC operations include performing (i) encoding the MTB data as a function of a data vector within each of the beats and a parity check matrix and (ii) decoding including computing a syndrome of the encoded MTB data and decoding corresponding Bose-Chaudhuri-Hocquenghem (BCH) codes; and
wherein the encoding and decoding include vector matrix multiplication.

9. The method of claim 8, wherein the digital system is an on-application specific integrated circuit (on-ASIC) ECC system communicatively coupled to a memory.

10. The method of claim 9, further including correcting the error.

11. The method of claim 8, wherein the beat is a Hamming code.

12. The method of claim 11, wherein the digital system is an on-application specific integrated circuit (on-ASIC) ECC system communicatively coupled to a memory.

13. The method of claim 12, further including checking whether an error exists in the beat based on the syndrome vector.

14. The method of claim 13, wherein the memory is a dynamic random access memory (DRAM).

* * * * *